United States Patent
Otremba et al.

(10) Patent No.: US 8,633,102 B2
(45) Date of Patent: Jan. 21, 2014

(54) MODULE COMPRISING A SEMICONDUCTOR CHIP

(75) Inventors: Ralf Otremba, Kaufbeuren (DE); Xaver Schloegel, Sachsenkam (DE); Khai Huat Jeffrey Low, Melaka (MY); Chee Soon Law, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/548,120

(22) Filed: Jul. 12, 2012

(65) Prior Publication Data

US 2012/0276693 A1 Nov. 1, 2012

Related U.S. Application Data

(62) Division of application No. 11/725,973, filed on Mar. 20, 2007, now Pat. No. 8,237,268.

(51) Int. Cl.
*H01L 21/44* (2006.01)
(52) U.S. Cl.
USPC .......................................... 438/613; 257/734
(58) Field of Classification Search
USPC ........................................... 438/613; 257/734
See application file for complete search history.

(56) References Cited

U.S. PATENT DOCUMENTS

| | | |
|---|---|---|
| 5,173,762 A | 12/1992 | Ota |
| 5,530,284 A | 6/1996 | Bailey |
| 5,557,842 A | 9/1996 | Bailey |
| 5,682,057 A | 10/1997 | Kuriyama |
| 6,032,850 A | 3/2000 | Orcutt |
| 7,253,507 B2 | 8/2007 | Kouzuki et al. |
| 2003/0057530 A1 | 3/2003 | Karrer |
| 2003/0209804 A1 | 11/2003 | Knapp et al. |
| 2004/0026753 A1 | 2/2004 | Matsuki et al. |
| 2004/0135237 A1 | 7/2004 | Funato et al. |
| 2004/0217488 A1 | 11/2004 | Luechinger |
| 2007/0001278 A1 | 1/2007 | Jeon et al. |
| 2008/0079065 A1 | 4/2008 | Zhang et al. |

FOREIGN PATENT DOCUMENTS

EP   0 446 937 A2   3/1991

*Primary Examiner* — Anthony Ho
(74) *Attorney, Agent, or Firm* — Slater & Matsil, L.L.P.

(57) ABSTRACT

A module includes a semiconductor chip having at least a first terminal contact surface and a second terminal contact surface. A first bond element made of a material on the basis of Cu is attached to the first terminal contact surface, and a second bond element is attached to the second terminal contact surface. The second bond element is made of a material different from the material of the first bond element or is made of a type of bond element different from the type of the first bond element.

20 Claims, 7 Drawing Sheets

Top view

Side view

Bottom view

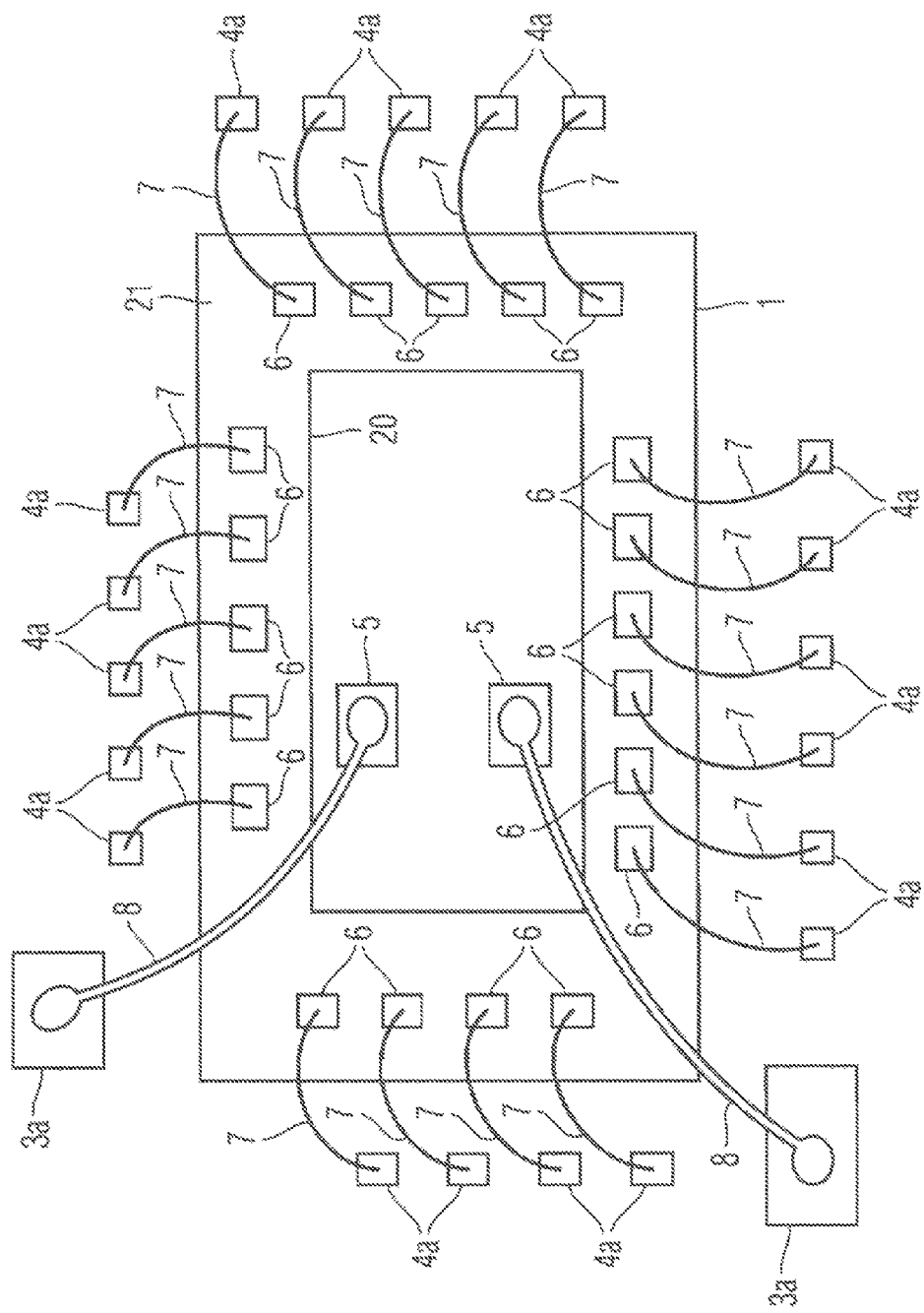

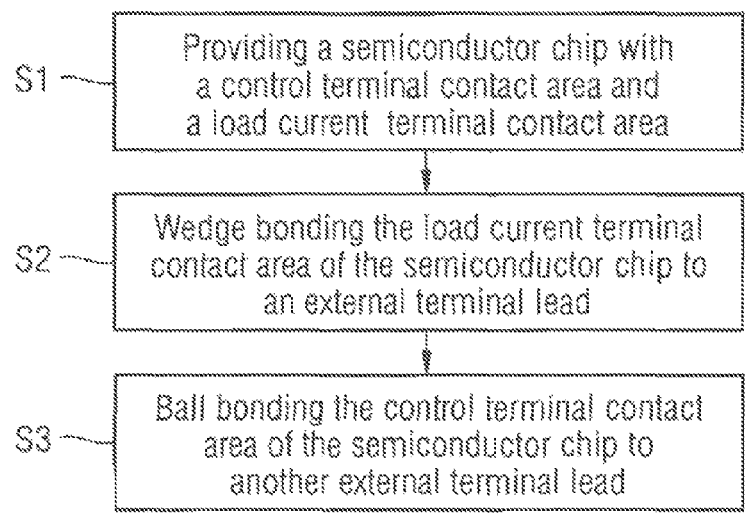
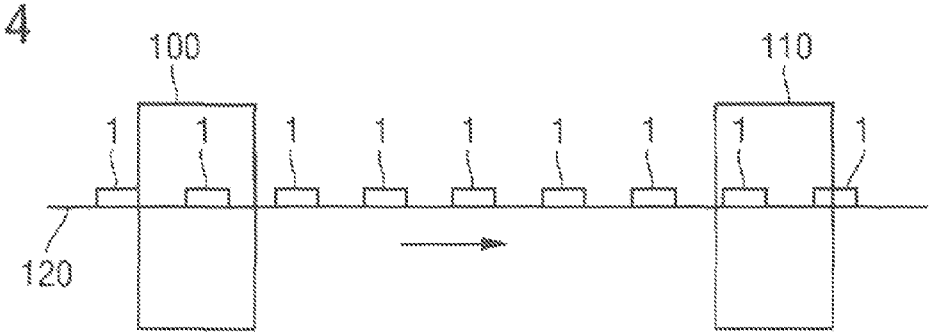
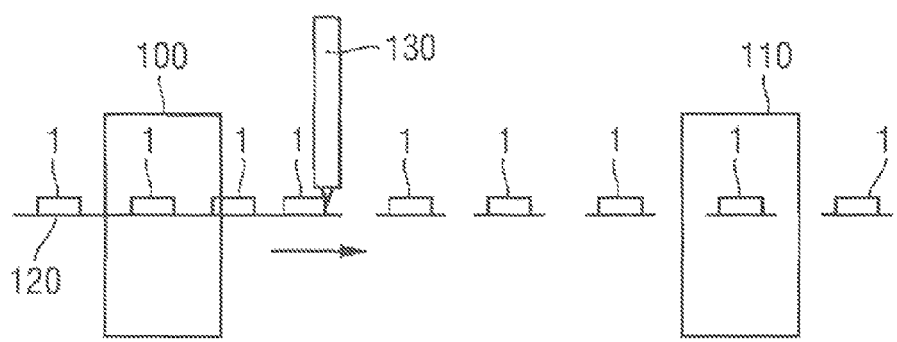

MODULE COMPRISING A SEMICONDUCTOR CHIP

This is a divisional application of U.S. application Ser. No. 11/725,973, entitled "Module Comprising a Semiconductor Chip," which was filed on Mar. 20, 2007 and is incorporated herein by reference

TECHNICAL FIELD

The invention relates to a module comprising a semiconductor chip and in various embodiments to an electrically bonding of the semiconductor chip.

BACKGROUND

Various techniques are available to electrically connect a semiconductor chip in a module to external terminals of the module. For example, clip-bonding, ribbon-bonding or wire-bonding are techniques known in the art. Further, various different materials have been used for the bond element, among them Al, Cu or Au. The selection of the bonding technique may have a significant impact on the overall manufacturing costs and performance of the module.

BRIEF DESCRIPTION OF THE DRAWINGS

Aspects of the invention are made more evident by way of example in the following detailed description of embodiments when read in conjunction with the attached drawing figures, wherein:

FIG. 10 is top view of a further embodiment;

FIG. 11, show illustrations of a capillary tool used for wedge wire-bonding;

FIG. 12, shows illustrations of a capillary tool used for ball wire-bonding;

FIG. 13 is a flow chart illustrating processing steps for manufacturing a module;

FIG. 14 is a schematic diagram illustrating an embodiment of a processing line for manufacturing modules; and FIG. 15 is a schematic diagram illustrating another embodiment of a processing line for manufacturing modules.

DETAILED DESCRIPTION OF ILLUSTRATIVE EMBODIMENTS

Modules described in the following comprise at least one electronic component such as a semiconductor chip. The electronic component can be a power semiconductor chip or a chip operating in the standard power (i.e., non-power) regime, e.g., a logic integrated circuit or a sensor chip, e.g., a CCD (charge coupled device) or for instance a MEMS (micro-electronical mechanical structure) such as a pressure sensor etc.

A power semiconductor chip may have a power consumption that spans over a wide range, starting from about one or several amperes and about five or more volts to several hundreds of amperes or several hundreds of volts. For example, a power semiconductor chip may be a MOSFET (Metal Oxide Semiconductor Field Effect Transistor), JFET (Junction Field Effect Transistor), IGBT (Insulated-Gate Bipolar Transistor), BJT (Bipolar Junction Transistor) or thyristor.

The semiconductor chip may be a vertical semiconductor device or a horizontal semiconductor device. A vertical semiconductor device has a top face with a first contact surface and a bottom face with a second contact surface. The load current flows in a vertical direction between the top contact surface and the bottom contact surface. In contrast thereto, in a lateral semiconductor device, both load current contact surfaces are arranged on the top face of the semiconductor chip.

The module may be packaged, i.e., may comprise a mold compound. The mold compound may, for example, be made of a thermoplastic resin or a thermosetting plastic, for example epoxy resin. It typically encapsulate one or more chips of the module. A backside of a carrier on which the chip or the chips are mounted may either be over-molded by the mold compound or may remain exposed. It is also possible that the chip carrier(s) or the chip(s) are connected to a heat sink which remains at least partially uncovered by the mold material.

Figure 1:
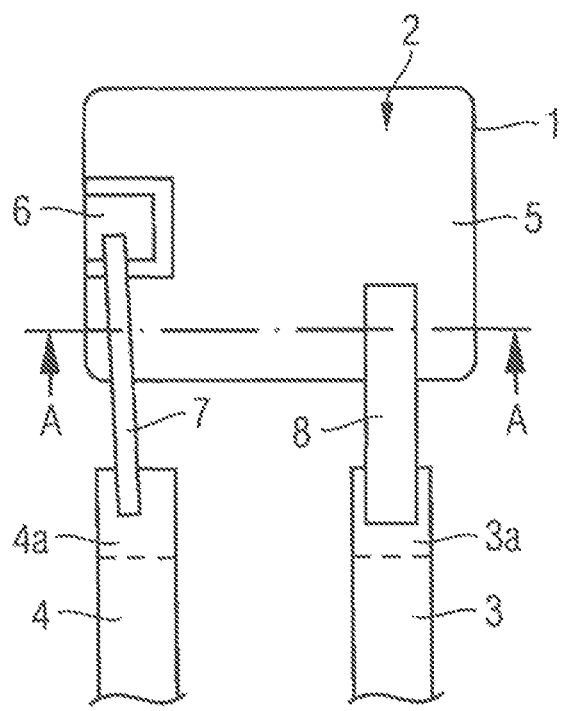
FIG. 1 is top view of an embodiment of a module.

FIG. 1 shows a module comprising a semiconductor chip 1 having a top surface 2 and leads 3, 4 which may represent external terminals for electrically connecting the semiconductor chip 1 to an external assembly, for instance a circuit board or another mounting platform on which the module is to be mounted. The top surface 2 of the semiconductor chip 1 comprises two conductive contact areas 5, 6. The contact areas 5, 6 are insulated from each other.

The contact area 6 of the semiconductor chip 1 is interconnected to a post area 4a of lead 4 by a bond wire 7 which is typically made on the basis of Cu, e.g., may be made of Cu or of a Cu metal alloy. Such Cu wires may contain more than 90 wt % Cu and contributions of other metal elements such as Ni, Fe etc. Further elements such as P, S may be added in low concentrations (usually smaller than 1 wt %) to control the physical characteristics of the wire. The contact area 5 of the semiconductor chip 1 is interconnected to a post area 3a of the lead 3 by an electrically conductive bond element 8.

In non-power semiconductor chips, the contact areas 5, 6 may be common chip contact pads used for any signals such as digital input/output signals or power supply. In power semiconductor chips, the contact area 5 may be a load current contact area, e.g., the drain or source electrode of a power transistor implemented in the semiconductor chip 1. The contact area 6 may be a control signal contact area, e.g., the gate electrode of such power transistor.

According to a first embodiment, the bond element 8 may be made of a material different from the material of which the bond wire 7 is made, e.g., different from Cu or a Cu metal alloy. The bond element 8 may for instance be an Al or Au bond wire. Al bond wires are typically used for contacting load electrodes of a power semiconductor chip to external terminal leads since Al (other than Cu) provides the possibility to use large diameter wires capable of transporting high currents. However, for providing a large cross section for high current transport, bond element 8 may also be a clip- or ribbon-bond element made of a material different from the material of bond wire 7. Such clip- or ribbon-bond element may also be made of Al.

As will be explained in more detail later, the concept of using different bond element materials may provide for a reduction of the total costs involved in bonding the semiconductor chip 1 to leads 3, 4. That is because bond wires made on the basis of Cu may be bonded by an inexpensive ball wire bonding process and Cu is a low cost material. Further, ball bonding a Cu bond wire is more than an order of magnitude faster than, e.g., wedge wire bonding an Al bond wire. These effects may more than compensate any potential extra expenditure caused by the usage of two different bond element materials.

According to another embodiment, the bond wire 7 and the bond element 8 may distinguish from each other in that they are necessarily of different type. The bond element 8 has a rectangular shaped cross section, i.e., is no wire. Again, bond wire 7 is made on the basis of Cu, e.g., may be made of Cu or of a Cu metal alloy. The bond element 8 may be a clip- or ribbon-bond element. It may be made of a material based on Cu. Further, as already stated in relation with the aforementioned aspect of using different bond element materials, the bond element 8 may be made of materials different from Cu, e.g., Al or Au.

Figure 2:
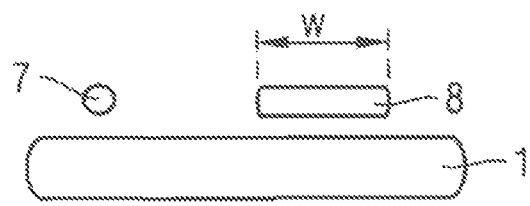
FIG. 2 is a cross sectional view along line A-A shown in FIG. 1.

Typically, the lateral dimension W of the bond element 8 is larger than the diameter of bond wire 7. Therefore, higher currents may flow through bond element 8 than through bond wire 7. The lateral dimension W of bond element 8 may be larger than 0.5 mm for a ribbon-bond element 8 (cf. FIG. 2) and may also be larger than 0.5 mm (but may even have a lateral dimension W of the same order as the lateral dimension of the semiconductor chip 1) for a clip-bond element (cf. FIG. 6).

The aspects of using a bond wire made on the basis of Cu for bonding one contact area 6 of the semiconductor chip 1 and using a bond element of different material and/or different type for bonding another contact area 5 of the semiconductor chip 1 may provide technological benefit because they allow to use a material and/or type of the bond element 8 which is optimum for the physical requirements (for instance high current) of the respective electrical connections.

Figure 3:
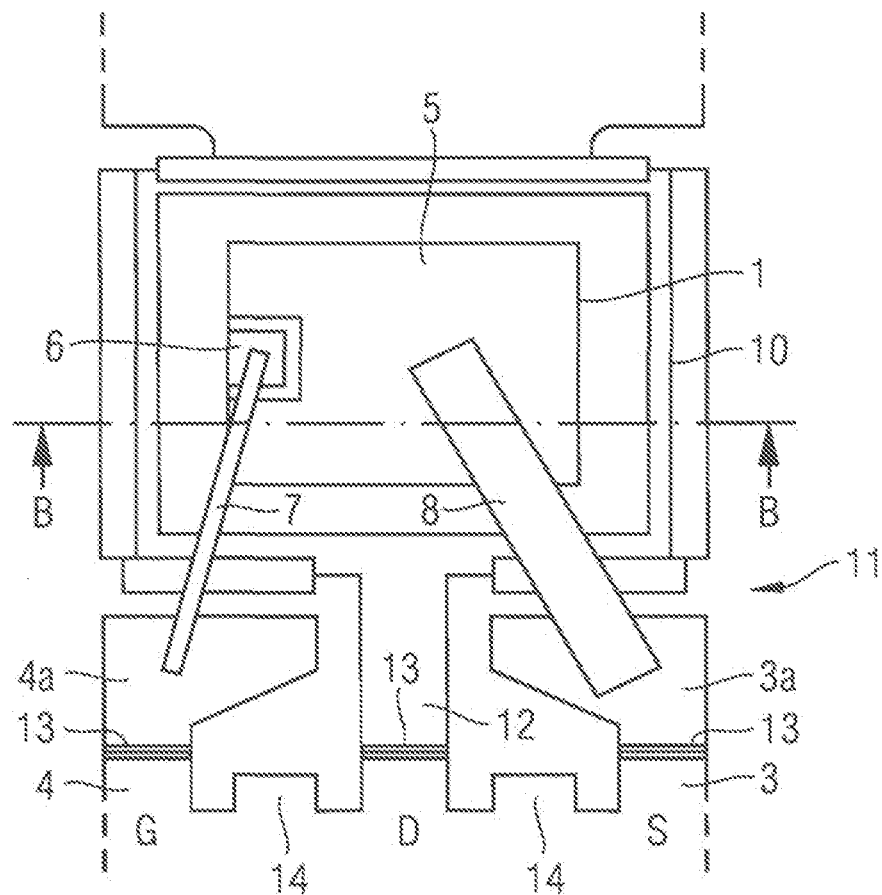
FIG. 3 is a top view of another embodiment of a module.

In FIG. 3 the semiconductor chip 1 is mounted on a die pad 10. The same reference signs used throughout the figures reference similar parts therein. The die pad 10 forms part of a leadframe 11. The leadframe 11 is a structured sheet of metal, for instance Cu. This structured sheet of metal further comprises a lead 3 terminated by a post area 3a, a lead 4 terminated by a post area 4a and a lead 12 forming an integral extension of the die pad 10.

The semiconductor chip 1 may be a vertical p-type power transistor. In this case, the die pad 10 is connected to the drain (D) contact area of the transistor, as the drain (D) contact area is located at the bottom face of the semiconductor chip 1. The top face of the semiconductor chip 1 carries a source (S) contact area 5 and a gate (G) contact area 6. The source contact area 5 is interconnected to the post area 3a of lead 3 by a bond element 8 (for instance a thick Al or Au bond wire or a ribbon-bond element made, e.g., of Cu or Al) and the gate contact area 6 is interconnected to the post area 4a of lead 4 by a bond wire 7 on the basis of Cu.

Leads 3, 4, 12 may serve as external terminals of the module. Lines 13 indicate a bend zone at which leads 3, 4, 12 are expected to stick out of a package which may be applied later. Further, frame bars 14 interconnecting the leads 3, 4, 12 will be cut-off at a later stage of the manufacturing process such that leads 3, 4, 12 will be insulated from each other in the finished module.

The bond wire 7 may have a diameter in the range between 10 and 200 μm. As typically only small currents are transferred via bond wire 7, the diameter of bond wire 7 may in many cases be smaller than 50 μm. The smaller the diameter the smaller the unavoidable damage to the respective contact area and the structure below the contact area. This holds especially true for a Cu bond wire which is usually harder than, say, an Al bond wire.

If the semiconductor chip 1 is a power device, the cross-sectional dimensions of bond element 8 should be large enough in order to allow for the transfer of load currents that may have a considerable magnitude (for instance up to several hundreds of amperes). Thus, if the bond element 8 is a bond wire, the bond wire 8 (made, e.g., of Al) may have a diameter in the range between 50 and 800 μm.

It is to be noted that a bond wire 7 on the basis of Cu is a factor of three less expensive than a bond wire made of Al. Further, as will be explained in more detail in the following, the process of bonding a Cu bond wire involves considerable less costs than the process of bonding an Al bond wire because the process of bonding a Cu bond wire is about ten times faster than the process of bonding an Al bond wire (e.g., 0.1 s in comparison to 1 s). Therefore, the concept of "mixed bonding" proposed herein provides substantial benefits compared to a process in which solely Al bond wires are used.

Figure 4:
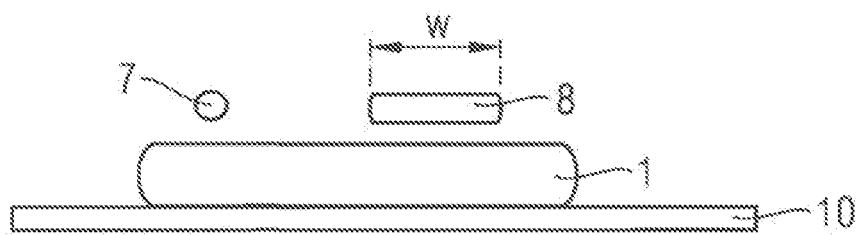
FIG. 4 is a cross sectional view along line B-B shown in FIG. 3.

Otherwise, if the bond element 8 has a rectangular cross section, cf. FIG. 4, the bond element 8 may be a ribbon-bond made of Cu or Al. The lateral dimension W may be chosen as indicated above for ribbon-bonds.

Figure 5:
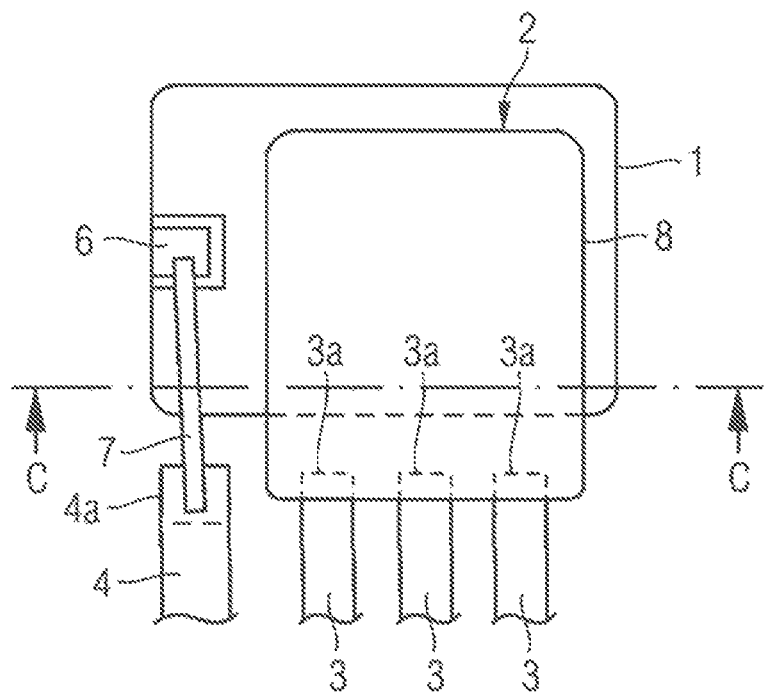
FIG. 5 is a top view of a further embodiment of a module.
Figure 6:
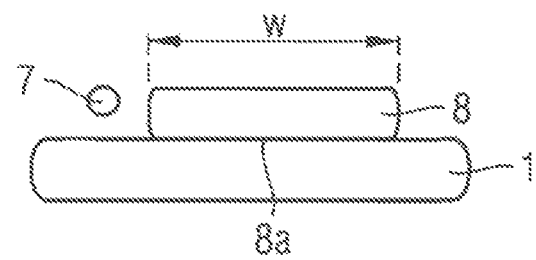
FIG. 6 is a cross sectional view along line C-C shown in FIG. 5.

FIG. 5 shows a module that differs from the module shown in FIGS. 3 and 4 mainly in that the bond element 8 is a clip-bond element. As shown in FIG. 6, similar to a ribbon-bond element 8, a clip-bond element 8 has a rectangular cross section. However, contrary to the ribbon-bond element 8, the clip-bond element 8 has a flat lower surface 8a that makes contact with the contact area of the chip 1 across a large area. For example, if the chip 1 is a vertical p-type power transistor like in FIG. 3, the size of the lower surface 8a of the clip-bond element 8 is chosen to cover all, or almost all of source contact region 5. This way, compared to a ribbon-bond element 8, a significantly larger current can be carried from the clip-bond element 8 to the chip 1. Further, different from a ribbon-bond element 8, clip-bond elements 8 are soldered to the respective contact area of the chip 1. Typically, as already mentioned, the width W of a clip-bond element 8 is larger than the width W of a ribbon-bond element 8. Thus, as an example, multiple leads 3 may be bonded to the clip-bond element 8 in order to meet high current demands.

Similar to a ribbon-bond element 8, the clip-bond element 8 can be made of a material on the basis of Cu or Al, and the bond wire 7 may be made of a material on the basis of Cu.

It is to be noted that corrosion on a Cu pad is minimum if a bond wire 7 made of Cu is bonded to a Cu pad. Thus, in all embodiments where the contact area 6 on semiconductor chip 1 is made of Cu, a high corrosion resistance of the semiconductor chip bond is achieved.

It is further to be noted that, if the leadframe 11 is made of material on the basis of Cu, it is not necessary to apply any coating to the post areas 3a and 4a because both a Cu bond wire as well as an Al bond wire may be contacted directly to a Cu surface. At the Cu—Cu contact, corrosion is again minimized. This further reduces costs in comparison with alternate bonding approaches. For instance, the usage of Au bond wires 7, 8 would require to apply an Ag or Au coating on the post areas 4a and 3a, respectively.

On the other hand, bond wires on the basis of Cu may be harder than bond wires made of alternate materials like Al or Au. Therefore, especially if thick Cu bond wires are used, there could be a risk that the bond might damage or even break the conductive contact area on the semiconductor chip and thus could cause failure of the semiconductor chip 1. As the bond element 8 is a wire made of a material different from Cu or a bond element of different type than a wire (e.g., a ribbon- or clip-bond element 8), the problem of damages caused by thick Cu wires on contact area 5 is avoided.

FIG. 10 shows a standard power (i.e., non-power) semi-conductor chip 1 which may be a sensor chip, e.g., a CCD or a MEMS (for instance a pressure sensor chip), or a logic circuit. Semiconductor chip 1 is a horizontal semiconductor device. An active region 20 of the semiconductor chip 1 is arranged in a central part at the upper side of the semiconductor chip 1.

Within the active region 20 are located contact areas 5, which may be made of Cu or Al. These contact areas 5 are interconnected to post areas 3a provided on a leadframe or another semiconductor chip carrier (not shown) by bond wires 8 made of Al. The bond wires 8 are connected to post areas 3a and contact areas 5 by a wedge bonding process.

A non-active region 21 of the semiconductor chip 1 extends between the active region 20 and a periphery of the semiconductor chip 1. In this non-active region 21 contact areas 6 are located. These contact areas 6 are interconnected to post areas 4a provided on the leadframe or semiconductor chip carrier (not shown) by bond wires 7 made of a material on the basis of Cu. The bond wires 7 are connected to post areas 4a by a wedge bonding process and to contact areas 6 by a ball bonding process, respectively.

Such implementation may be beneficial because on the one hand, there is no risk that the Cu bond wires 7, which may be chip-bonded with a cost efficient but pressure applying ball bonding process, damage active structures of the semiconductor chip 1, and on the other hand, the contact areas 5, which are bonded by Al bond wires 8 using a low pressure wedge bonding process, may be placed within the active region 20 of the semiconductor chip 1. Therefore, as the active region 20 and the non-active region 21 may be used for bonding the semiconductor chip 1, the size of the semiconductor chip 1 may be reduced.

In view of the above, the modules shown in FIGS. 1 to 10 may in particular be designed according to the following principles.

A non-power semiconductor chip 1, e.g., a logic circuit chip with Cu contact areas 6, is mounted on a leadframe 11 made of Cu. Bond wire 7 is made of Cu to minimize corrosion at the conductive contact area 6 on the semiconductor chip 1 and the post area 4a on lead 4. Bond wire 8 is for instance made of Au in order to prevent damage of conductive contact area 5 on semiconductor chip 1, or to prevent damage to the active region (e.g., sensor region) of the chip situated just below the contact area.

A power semiconductor chip 1 is mounted on a leadframe 11 made of Cu. Bond wire 7 is made of Cu to minimize corrosion at the conductive contact area 6 on the semiconductor chip 1 and the post area 4a on lead 4. Bond wire 8 is made of Al in order to provide a large diameter for high currents.

A power semiconductor chip 1 is mounted on a leadframe 11 made of Cu. Bond wire 7 is made of Cu to minimize corrosion at the conductive contact area 6 on the semiconductor chip 1 and the post area 4a on lead 4. Bond element 8 is a ribbon bond element made of Al or Cu in order to allow for still higher currents than attainable by an Al bond wire.

A power semiconductor chip 1 is mounted on a leadframe 11 made of Cu. Bond wire 7 is made of Cu to minimize corrosion at the conductive contact area 6 on the semiconductor chip 1 and the post area 4a on lead 4. Bond element 8 is a clip bond element made of Al or Cu in order to allow for still higher currents than attainable by a ribbon-bond element.

Figure 7:
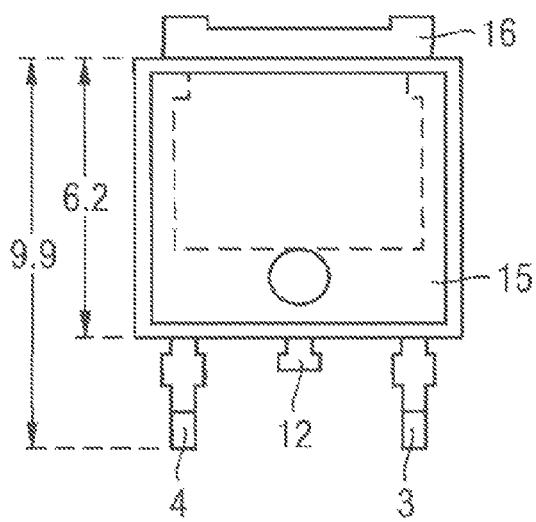
FIG. 7 is a top view of the module shown in FIG. 3 comprising a mold compound.
Figure 8:
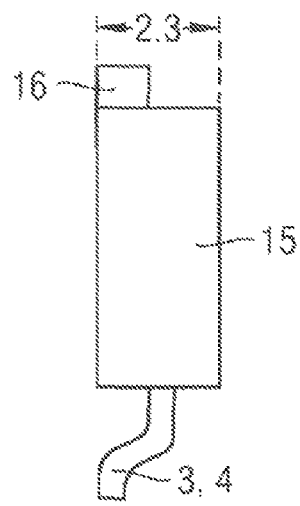
FIG. 8 is a side view of the module shown in FIG. 7.
Figure 9:
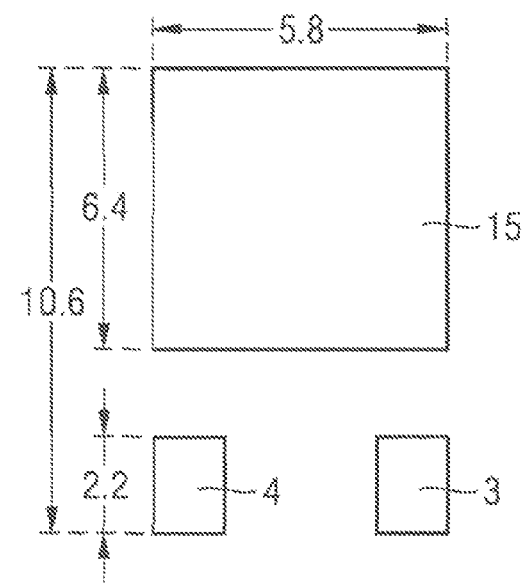
FIG. 9 is a footprint of the module shown in FIG. 7.

Typically, the modules shown in FIGS. 1 to 10 are packaged. FIG. 7 illustrates an embodiment in which the module shown in FIG. 3 comprises a mold compound package 15. As an example, a three-terminal TO 252 package 15 may be used. Possible dimensions of such package 15 are indicated in FIGS. 7 to 9 in units of mm. As may be seen in the bottom view (FIG. 9), the package 15 may have a footprint of 5.8 mm×6.4 mm. Including leads 3, 4, the module may have a length of 10.6 mm. Of course, other dimensions as indicated in FIGS. 3 to 5 are possible.

A heat sink 16 may be contacted to the bottom of the die pad 10 and protrude out of the package 15.

Figure 11A:
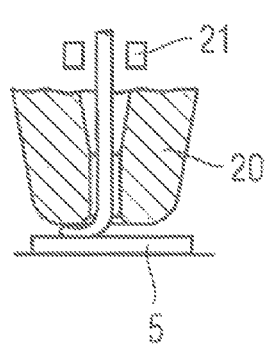
FIGS. 11a-11c, collectively
Figure 11B:
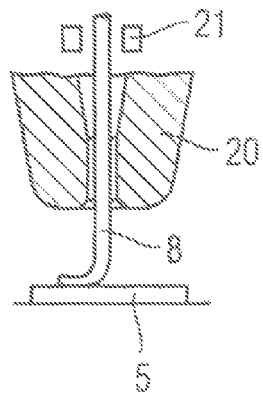
Figure 11C:
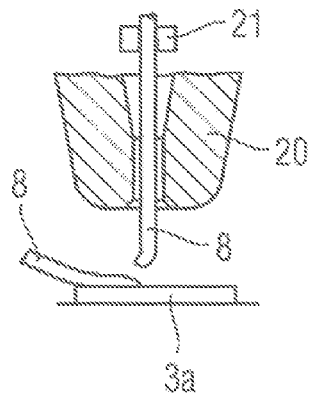

FIG. 11 illustrates steps of a wedge bonding process which may be applied for bonding the bond wire 8 to the contact area 5 on the semiconductor chip 1. The bond wire 8 extends through a capillary tool 20 and may be clamped therein by a wire clamp 21. In a first step, the capillary tool 20 is positioned over the contact area 5 and lowered to the surface of the contact area 5. The bond wire 8 is pressed on the surface of the contact area 5 by applying a specific pressure by means of the capillary tool 20 (FIG. 11a). Further, ultra-sonic energy is applied. The combination of pressure and ultra-sonic energy at ambient temperature results in a fusion of the wire material and the contact area material, which causes the bond wire 8 to adhere to the contact area 5. Then, the capillary tool 20 is lifted with released wire clamp 21 (FIG. 11b) and is transferred to and repositioned over post area 3a of lead 3. On post area 3a, a second wedge bonding process is carried out. Then, the bond wire 8 is clamped by the wire clamp 21 and the capillary tool 20 is lifted. Due to the adhesion of the bond wire 8 on the post area 3a, the bond wire 8 breaks (FIG. 11c) and the wedge bond connection is finished. Wedge bonding is carried out typically with bond wires made of Al or Cu. Bonding a wire with the wedge of a capillary tool leaves a typical foot shaped bond contact on the contact area that has a flat region and a heel (see FIG. 11b). In order not to over-bend or break the heel region of the bond contact, the bond wire 8 is drawn in a direction away from the wedge bond foot.

Figure 12A:
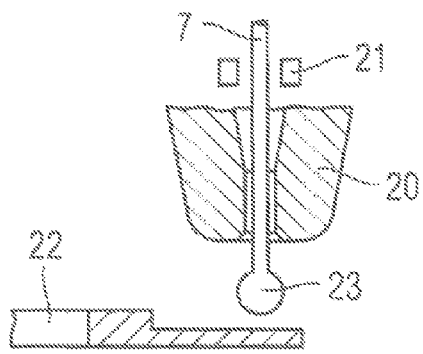
FIGS. 12a-12c, collectively
Figure 12B:
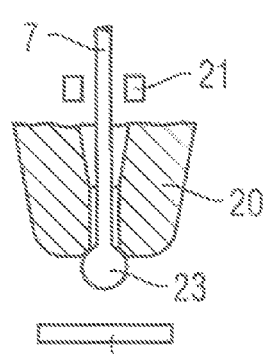
Figure 12C:
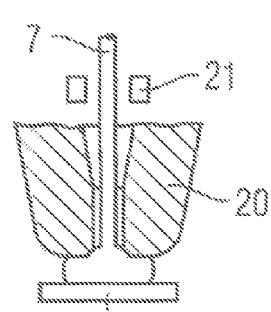

FIG. 12 depicts process steps of a ball wire bonding process. In the ball wire bonding process, also a capillary tool 20 equipped with a wire clamp 21 is used. In a first step, a ball 23 is formed at the end of the wire 7 (e.g., made on the basis of Cu) protruding out of the capillary tool 20. Ball formation may be performed by an electric flame-off spark generated between a spark electrode 22 and the end of bond wire 7 (12a). After ball formation, the capillary tool 20 is positioned over the contact area 6 on the semiconductor chip 1 and lowered to the surface thereof (FIG. 12b). Then, the ball 23 is welded on the contact area 6 by the application of pressure, ultra-sonic energy and thermal energy, i.e., heat (FIG. 12c). After the weld formation, the capillary tool 20 is lifted with released wire clamp 21 and repositioned over post area 4a of lead 4 (not shown in FIG. 12; see e.g., FIG. 10). On post area 4a, a wedge bonding process similar to that explained in conjunction with FIG. 11 may be performed to break the bond wire 7. Alternatively, a ball bonding process or a nailhead bonding process may be used on post area 4a.

Ball bonding is carried out typically with bond wires made of Au or Cu. As ball bonding creates a rotationally symmetric bond foot (see FIG. 12c), bond wire 7 can be drawn in any lateral direction when starting out from the bond foot.

Thus, it is to be noted that the terms wedge bonding and ball bonding relate to the type of bonding bond wires 7, 8 to the chip contact areas 6 and 5, respectively. Bonding to the post areas 4a, 3a on leads 4 and 3 may be both accomplished by a wedge bonding process. More specifically, the term ball bonding comprises the process combinations ball-wedge, ball-nailhead and ball-ball, whereas the term wedge bonding comprises the combination wedge-wedge.

FIG. 13 illustrates a flow chart of a process used for manufacturing a module. At step S1, a semiconductor chip 1 with a control signal contact area 6 and a load current contact area 5 is provided. Then, at step S2, the load current contact area 5 is interconnected to an external terminal lead 3 of the module by a wedge bonding process performed at contact area 6. At step S3, the control signal contact area 6 of the semiconductor chip 1 is interconnected to another external terminal lead 4 by a ball bonding process performed at contact area 6. Step S2 may be carried out prior to the step S3, but it is also possible that step S3 is performed prior to or concurrently with step S2.

FIG. 14 schematically depicts a production line comprising a first wire bonding apparatus 100 and a second wire bonding apparatus 110, which are used in line processing for manufacturing modules. By way of example, the first wire bonding apparatus 100 uses a wedge-wedge wire bonding process (see e.g., FIG. 11) whereas the second wire bonding apparatus 110 uses a ball-wedge wire bonding process (see e.g., FIG. 12). The first wire bonding apparatus 100 is fed by a leadframe strip 120 comprising a series of connected leadframes as, e.g., depicted in FIG. 3. A semiconductor chip 1 is mounted on each leadframe 11. In the first wire bonding apparatus 100, the Al bond wires 8 are applied. The leadframe strip 120, which remains continuous, is then fed into the second wire bonding apparatus 110, which here is a ball wire bonding apparatus. In the ball wire bonding apparatus 110, the Cu wire bonds are applied. The leadframes 11 are then separated (not shown) downstream of the second wire bonding apparatus 110.

Alternatively, as depicted in FIG. 15, the first wire bonding apparatus 100 may process the continuous leadframe strip 120, whereas the second wire bonding apparatus 110 (e.g., a ball wire bonding apparatus) may process batches of one or more separate leadframes 11 with attached semiconductor chips 1. A separation of the leadframe strip 120 into single leadframes 11 is performed by a separating station 130 arranged in between the first wire bonding apparatus 100 and the second wire bonding apparatus 110. Again, it is to be noted that the succession of the wedge bonding step and the ball bonding step may be reversed and that it is also possible to perform both bonding processes within one common wire bonding apparatus.

What is claimed is:

1. A method for bonding a chip to a carrier, the method comprising:
    ball wire bonding a bond wire between a first terminal contact surface of the chip and a first contact of the carrier, wherein the bond wire comprises a first material; and
    wedge wire bonding a bond element between a second terminal contact surface of the chip to a second contact of the carrier, wherein the bond element comprises a second material, and wherein the second material is different than the first material.

2. The method according to claim 1, wherein wedge wire bonding is performed prior to the ball wire bonding.

3. The method according to claim 1, wherein ball wire bonding is performed prior to the wedge wire bonding.

4. The method according to claim 1, wherein the first terminal contact is a gate contact of a transistor, and wherein the second terminal contact is a source or a drain contact of the transistor.

5. The method according to claim 1, wherein the second material comprises aluminum (Al) or gold (Au).

6. The method according to claim 1, wherein the bond element comprises a ribbon-bond element or a clip bond element.

7. The method according to claim 1, wherein the chip comprises a power semiconductor chip, a MEMS or a CCD.

8. A method for bonding a semiconductor chip to a leadframe, the method comprising:
    ball wire bonding a bond wire between a first terminal contact surface of a transistor disposed in the semiconductor chip and a first lead of the leadframe, wherein the bond wire comprises copper (Cu); and
    wedge wire bonding a bond element between a second terminal contact surface of the transistor of the semiconductor chip to a second lead of the leadframe, wherein the bond element comprises a material different from copper (Cu).

9. The method according to claim 8, wherein the first lead and the second lead comprise the same material.

10. The method according to claim 8, wherein the first terminal contact is a gate contact, and wherein the second terminal contact is a source contact.

11. The method according to claim 8, wherein the material different from Cu comprises aluminum (Al) or gold (Au).

12. The method according to claim 8, wherein the transistor is a vertical power transistor.

13. The method according to claim 8, wherein the bond element comprises a ribbon-bond element or a clip bond element.

14. A method for manufacturing a semiconductor device, the method comprising:
    placing a plurality of semiconductor chips on a leadframe strip, the leadframe strip comprises a series of connected leadframes, wherein one semiconductor chip is placed on one leadframe;
    for each semiconductor chip, ball wire bonding a first bond wire between a first terminal contact surface of the semiconductor chip and a first contact of the leadframe, wherein the first bond wire comprises a first material;
    for each semiconductor chip, wedge wire bonding a second bond wire between a second terminal contact surface of the semiconductor chip to a second contact of the leadframe, wherein the second bond wire comprises a second material, and wherein the second material is different than the first material; and
    forming the semiconductor device by singulating the leadframe strip.

15. The method according to claim 14, wherein wedge wire bonding comprises wedge wire bonding the second bond wire to second terminal contact surface and wedge wire bonding the second bond wire to the second contact of the leadframe.

16. The method according to claim 15, wherein ball wire bonding comprises ball wire bonding the first bond wire to first terminal contact surface and wedge wire bonding the first bond wire to the first contact of the leadframe.

17. The method according to claim 16, wherein the second bond wire comprises a clip bond element or a ribbon bond element.

18. The method according to claim 17, wherein the first material is Cu and wherein the second material is Al.

19. The method according to claim 14, wherein the first terminal contact surface is a control terminal and the second terminal contact surface is a load terminal of a power semiconductor chip.

20. The method according to claim 14, wherein one of the ball wire bonding or the wedge wire bonding is carried out before singulating the leadframe strip and then another of the ball wire bonding or the wedge wire bonding is carried out after singulating the leadframe strip.

* * * * *